(12) United States Patent
Mow et al.

(10) Patent No.: US 8,793,093 B2
(45) Date of Patent: Jul. 29, 2014

(54) TOOLS FOR DESIGN AND ANALYSIS OF OVER-THE-AIR TEST SYSTEMS WITH CHANNEL MODEL EMULATION CAPABILITIES

(75) Inventors: Matt A. Mow, Los Altos, CA (US); Bo Niu, Sunnyvale, CA (US); Robert W. Schlub, Cupertino, CA (US); Ruben Caballero, San Jose, CA (US)

(73) Assignee: Apple Inc., Cupertino, CA (US)

( * ) Notice: Subject to any disclaimer, the term of this patent is extended or adjusted under 35 U.S.C. 154(b) by 442 days.

(21) Appl. No.: 13/095,656

(22) Filed: Apr. 27, 2011

(65) Prior Publication Data

US 2011/0270567 A1    Nov. 3, 2011

Related U.S. Application Data

(60) Provisional application No. 61/329,455, filed on Apr. 29, 2010.

(51) Int. Cl.
| | | |
|---|---|---|
| *H04B 17/00* | (2006.01) | |
| *H04B 7/04* | (2006.01) | |
| *G01R 29/10* | (2006.01) | |
| *G01R 29/08* | (2006.01) | |

(52) U.S. Cl.
CPC .......... *H04B 17/0087* (2013.01); *H04B 17/009* (2013.01); *G01R 29/10* (2013.01); *G01R 29/0821* (2013.01); *H04B 7/0413* (2013.01)
USPC ..................... 702/108; 455/67.12; 455/67.14; 702/109

(58) Field of Classification Search
CPC ............. H04B 17/0087; H04B 17/009; H04B 7/0413; G01R 29/10; G01R 29/0821
USPC ............. 702/120, 108, 109; 455/67.12, 67.14
See application file for complete search history.

(56) References Cited

U.S. PATENT DOCUMENTS

| | | | |
|---|---|---|---|
| 2006/0140289 A1* | 6/2006 | Mandyam et al. | ............ 375/260 |
| 2006/0194553 A1 | 8/2006 | Ozaki et al. | |
| 2007/0127559 A1 | 6/2007 | Chang | |
| 2008/0056340 A1 | 3/2008 | Foegelle | |
| 2011/0084887 A1 | 4/2011 | Mow et al. | |
| 2012/0071107 A1* | 3/2012 | Falck et al. | ................ 455/67.12 |

FOREIGN PATENT DOCUMENTS

WO    WO 2010094000 A2 *    8/2010

OTHER PUBLICATIONS

L. Schumacher et al., "From antenna spacings to theoretical capacities—Guidelines for simulating MIMO systems," in Proc. IEEE Int. Symp. Pers., Indoor, Mobile Radio Commun., Sep. 2002, vol. 2, pp. 587-592.*

Cheng-Xiang Wang et al. "Spatial-Temporal Correlation Properties of the 3GPP Spatial Channel Model and the Kronecker MIMO Channel Model," Jan. 2007, EURASIP Journal on Wireless Communications and Networking, vol. 2007, pp. 1-9.*

* cited by examiner

*Primary Examiner* — Jonathan C Teixeira Moffat
*Assistant Examiner* — Liam R Casey
(74) *Attorney, Agent, or Firm* — Meyertons, Hood, Kivlin, Kowert & Goetzel, P.C.

(57) ABSTRACT

A wireless electronic device may serve as a device under test in a test system. The test system may include an array of over-the-air antennas that can be used in performing over-the-air wireless tests on the device under test (DUT). A channel model may be used in modeling a multiple-input-multiple-output (MIMO) channel between a multi-antenna wireless base station and a multi-antenna DUT. The test system may be configured to perform over-the-air tests that emulate the channel model. A design and analysis tool may be used to identify an optimum over-the-air test system setup. The tool may be used in converting a geometric model to a stochastic model for performing conducted tests. The tool may be used in converting a stochastic model to a geometric model and then further convert the geometric model to an over-the-air emulated stochastic model. The over-the-air emulated stochastic model may be used in performing conducted tests.

13 Claims, 12 Drawing Sheets

$$h_{u,s,n}(t) = \sqrt{\frac{P_n \sigma_{SF}}{M}} \sum_{m=1}^{M} \left( \begin{pmatrix} \sqrt{G_{BS}(\theta_{n,m,AoD})} \exp(j[kd_s \sin(\theta_{n,m,AoD})]) \times \\ \sqrt{G_{MS}(\theta_{n,m,AoA})} \exp(j[kd_u \sin(\theta_{n,m,AoA})]) \times \\ \exp(j\Phi_{n,m}) \times \exp(jk\|v\| \cos(\theta_{n,m,AoA} - \theta_v)t) \end{pmatrix} \right)$$

FIG. 5A $$h_{u,s,n}(t) = \sqrt{\frac{P_n \sigma_{SF}}{M}} \sum_{m=1}^{M} \left( \begin{bmatrix} \chi_{BS}^{(v)}(\theta_{n,m,AoD}) \\ \chi_{BS}^{(h)}(\theta_{n,m,AoD}) \end{bmatrix}^T \begin{bmatrix} \exp(j\Phi_{n,m}^{(v,v)}) & \sqrt{r_{n1}}\exp(j\Phi_{n,m}^{(v,h)}) \\ \sqrt{r_{n2}}\exp(j\Phi_{n,m}^{(h,v)}) & \exp(j\Phi_{n,m}^{(h,h)}) \end{bmatrix} \begin{bmatrix} \chi_{MS}^{(v)}(\theta_{n,m,AoA}) \\ \chi_{MS}^{(h)}(\theta_{n,m,AoA}) \end{bmatrix} \right)$$
$$\times \exp(j[kd_s \sin(\theta_{n,m,AoD})]) \times \exp(j[kd_u \sin(\theta_{n,m,AoA})]) \times \exp(jk\|v\| \cos(\theta_{n,m,AoA} - \theta_v)t)$$

FIG. 5B $$\rho_{theoretical} = E\left\{\frac{h_{u1,s1,n}h^*_{u2,s2,n}}{\sigma_{h_{u1,s1,n}}\sigma_{h_{u2,s2,n}}}\right\}$$

FIG. 6

CALCULATE POWER AZIMUTH SPECTRUM (PAS):

$$PAS_{laplacian}(\theta) = \frac{Q_n}{\sqrt{2}\sigma_n} \exp\left[-\frac{\sqrt{2}|\theta_n - \theta_n|}{\sigma_n}\right], \text{ WHERE}$$

$Q_n$ is a function of BS and MS antenna patterns $\sqrt{G_{BS}(\theta_{n,m,AoD})}$ and $\sqrt{G_{MS}(\theta_{n,m,AoA})}$

⎧ 67

COMPUTE APPROXIMATE VALUE OF THEORETICAL SPATIAL CORRELATION

$$\rho_{theoretical}(\Delta d_s) = \int_{-\pi}^{\pi} \cos(k\Delta d_s \sin\theta) PAS(\theta) d\theta$$

$$\rho_{OTA} = E\left\{ \frac{h_{u1,s1,n}^{OTA} h_{u2,s2,n}^{OTA*}}{\sigma_{h_{u1,s1,n}^{OTA}} \sigma_{h_{u2,s2,n}^{OTA}}} \right\}$$

FIG. 8

$$PAS_{theoretical}(\theta) = \frac{Q_n}{\sqrt{2}\sigma_n} exp\left[-\frac{\sqrt{2}|\theta - \theta_n|}{\sigma_n}\right]$$

FIG. 10

$$PAS_{OTA}(r,\theta) = \Theta\left(\sum_{r=1}^{R} \sqrt{P_{n,r}} Q^{OTA} \delta(|\theta - \theta_n^{OTA}|)\right)$$

FIG. 11

TOOLS FOR DESIGN AND ANALYSIS OF OVER-THE-AIR TEST SYSTEMS WITH CHANNEL MODEL EMULATION CAPABILITIES

This application claims the benefit of provisional patent application No. 61/329,455, filed Apr. 29, 2010, which is hereby incorporated by reference herein in its entirety.

BACKGROUND

This relates generally to test systems, and, more particularly, to optimizing test setups for over-the-air test systems with channel model emulation capabilities.

Electronic devices often incorporate wireless communications circuitry. For example, devices may communicate using the Wi-Fi® (IEEE 802.11) bands at 2.4 GHz and 5.0 GHz. Communications are also possible in cellular telephone telecommunications bands and other wireless bands. In schemes such as multiple-input-multiple-output (MIMO) schemes, an electronic device may use an array of multiple antennas to handle wireless communications.

The wireless communications circuitry of an electronic device typically undergoes evaluation during development. For example, an antenna design may be evaluated to determine whether changes are needed before a device is released for large-volume manufacturing. If it is determined that an antenna design is not performing as well as desired, design changes can be made. For example, in a MIMO arrangement, additional antennas could be added. Changes could also be made to the placement of the antennas in a device and the types of antennas being used.

One way to evaluate wireless communications circuitry is to use conducted tests. In conducted tests, test equipment is connected to the radio-frequency circuitry of a device under test (DUT) directly using cables. Standards organizations have developed standardized channel models that can be used to represent a real-world communications path in a MIMO system. A channel model may, for example, be used to represent a communications path that includes reflections and other signal impairments, motion of the mobile station (DUT), etc. During conducted tests, a channel emulator may be used to emulate the signals associated with a given channel model.

In some situations it may be desirable to evaluate the performance of a DUT using over-the-air (OTA) radio-frequency signals. In a typical OTA test system, radio-frequency signals are transmitted from an OTA test system antenna to an antenna in a DUT. OTA tests may provide information on the performance of a particular design that might not otherwise be obtained using conducted tests with a channel emulator. For example, OTA tests may reveal information on how the shapes and placements of antennas in a MIMO array affect performance. OTA tests may also provide insight into the interplay between the housing and other portions of a DUT and the antennas in the MIMO array.

When performing OTA tests, it would be desirable to be able to use the same types of channel models that are available when performing conducted tests using channel emulators. This would allow a comparison of conducted test results and OTA test results and would help ensure that OTA test results accurately reflect the real world conditions that are modeled using the channel model.

It would therefore be desirable to be able to provide design and analysis tools that assist test personnel in optimizing an OTA test system so that OTA test results closely match the theoretical results expected from a channel model and that assist test personnel in performing other test functions.

SUMMARY

Wireless electronic devices may communicate with wireless equipment such as cellular telephone and local area network base stations. During testing, the wireless electronic devices may be referred to as devices under test.

A test system may be used to perform conducted test on a device under test. During conducted tests, a tester in the test system may be connected to the device under test by a wired path.

The test system may also contain a ring or other array of over-the-air antennas. The over-the-air antennas may be used to convey wireless signals between the tester and the device under test.

Channel models of wireless communications links such as channel models developed by standards organizations may be used in evaluating the performance of a device under test. The over-the-air antennas and tester in the test system may be used to perform over-the air tests that emulate a desired channel model.

Factors such as the placement of the over-the-air antennas in the test system, the average transmitted powers for each of the over-the-air antennas, number of antennas that can be used in the over-the-air test, and the antenna pattern may affect how well the test system is able to emulate a channel model.

A design and analysis tool may be provided for helping set up optimized high performance over-the-air test systems, and evaluating how accurately various over-the-air test system setups are able to emulate the channel model. By evaluating a number of different possible test system setups, an optimum test system setup may be identified.

The design and analysis tool may also be used in different applications when performing an over-the-air test, such as, but not limited to, converting a geometric channel model into a corresponding over-the-air emulated stochastic channel model; converting a stochastic channel model into an over-the-air emulated geometric channel model and further converting into an over-the-air emulated stochastic channel model. The tester in the test system may use the over-the-air emulated stochastic model in performing conducted tests on the device under test.

Further features of the invention, its nature and various advantages will be more apparent from the accompanying drawings and the following detailed description of the preferred embodiments.

BRIEF DESCRIPTION OF THE DRAWINGS

FIG. 5A and 5B show equations that may be used in computing channel coefficients in accordance with an embodiment of the present invention.

FIG. 6 shows an equation that may be used in computing a theoretical spatial correlation value for a channel model through the channel coefficient in accordance with an embodiment of the present invention.

FIG. 7 is a flow chart of illustrative steps involved in estimating a theoretical spatial correlation value associated with a given channel model, through power azimuth spectrum, in accordance with an embodiment of the present invention.

FIG. 8 shows an equation that may be used in computing an over-the-air spatial correlation value associated with a given channel model and a given OTA test system that is being used to emulate the given channel model, through channel coefficients, in accordance with an embodiment of the present invention.

FIG. 10 shows an equation that may be used in computing theoretical power azimuth spectrum in accordance with an embodiment of the present invention.

FIG. 11 shows an equation that may be used in computing an over-the-air power azimuth spectrum value associated with a given channel model and a given OTA test system that is being used to emulate the given channel model through power azimuth spectrum in accordance with an embodiment of the present invention.

DETAILED DESCRIPTION

Antennas are used in wireless electronic devices to support wireless communications. For example, antennas may be used in wireless electronic devices such as desktop computers, computer monitors, computer monitors containing embedded computers, wireless computer cards, wireless adapters, televisions, set-top boxes, gaming consoles, routers, or other electronic equipment. If desired, antennas may be used in portable electronic devices such as laptop computers, tablet computers, and small portable computers of the type that are sometimes referred to as handheld computers. Antennas may be also be used in wireless electronic devices such as cellular telephones and media players and in small devices such as wrist-watch devices, pendant devices, headphone and earpiece devices, and other wearable and miniature devices.

Wireless electronic devices may communicate with wireless equipment such as cellular telephone base stations, local area network equipment (e.g., IEEE 802.11 equipment), and other wireless network equipment. Wireless electronic devices are often mobile and are therefore sometimes referred to as mobile stations. The equipment that communicates with a mobile station is sometimes referred to as a base station. In testing environments, mobile stations are sometimes referred to as devices under test (DUTs).

Figure 1:
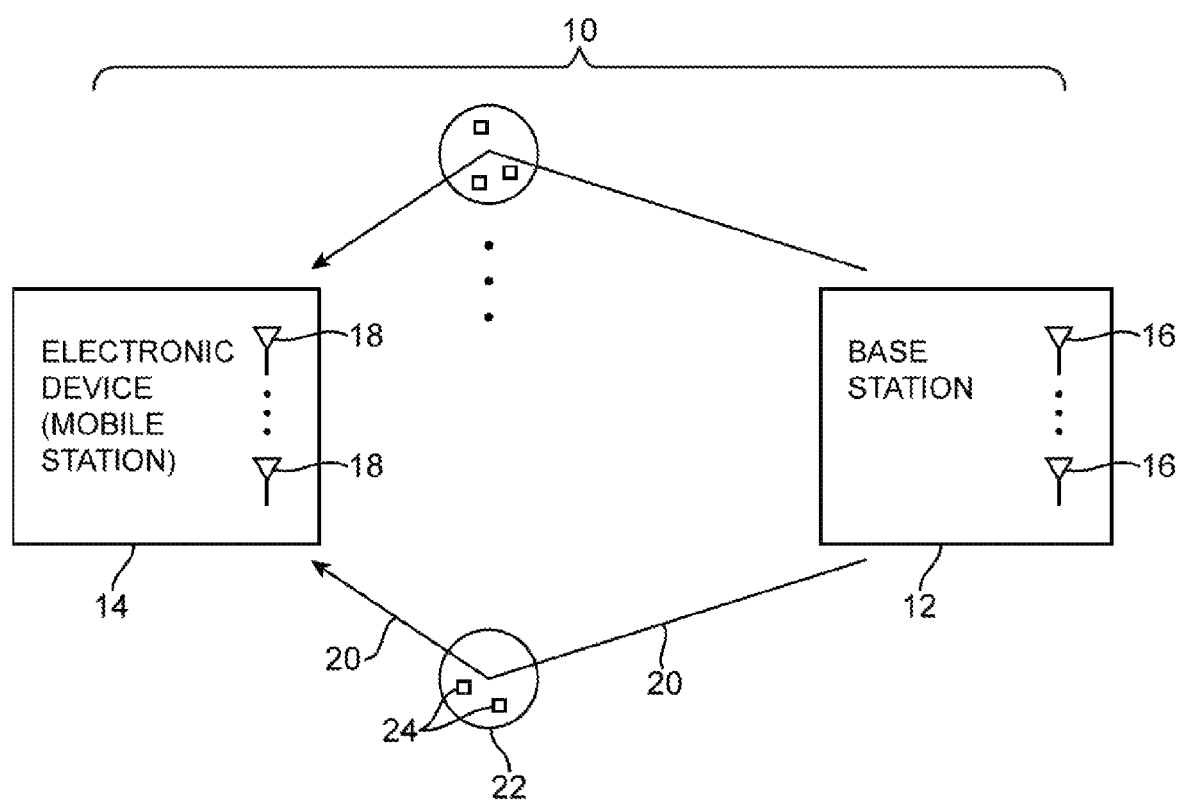
FIG. 1 is a diagram showing how a mobile station and a base station may communicate over a wireless communications channel in accordance with an embodiment of the present invention.

An illustrative environment (system 10) in which an electronic device communicates with a base station is shown in FIG. 1. As shown in FIG. 1, electronic device 14 may have antennas 18. Base station 12 may have antennas 16. Wireless signals may travel along various paths 20 between base station 12 and device 14. In real-world environments, radio-frequency signals may be reflected from obstacles such as trees and buildings. Because of the different properties and locations of these obstacles, the signals associated with each path 20 may have different associated delays and signal strengths.

Standards organizations have defined standardized channel models that represent typical environments of the type shown in FIG. 1. A channel model generally includes a number of clusters such as clusters 22 each of which contains multiple subpaths 24. The clusters and subpaths of a channel model represent the behavior of typical obstacles in a real-world physical channel between a base station and electronic device. A channel model may also be used to model typical electronic device movements in real world conditions (e.g., to represent motion of the electronic device at walking speeds of about 3 km/hour and at higher speeds such as speeds of 30 km/hour and 120 km/hour).

Figure 2:
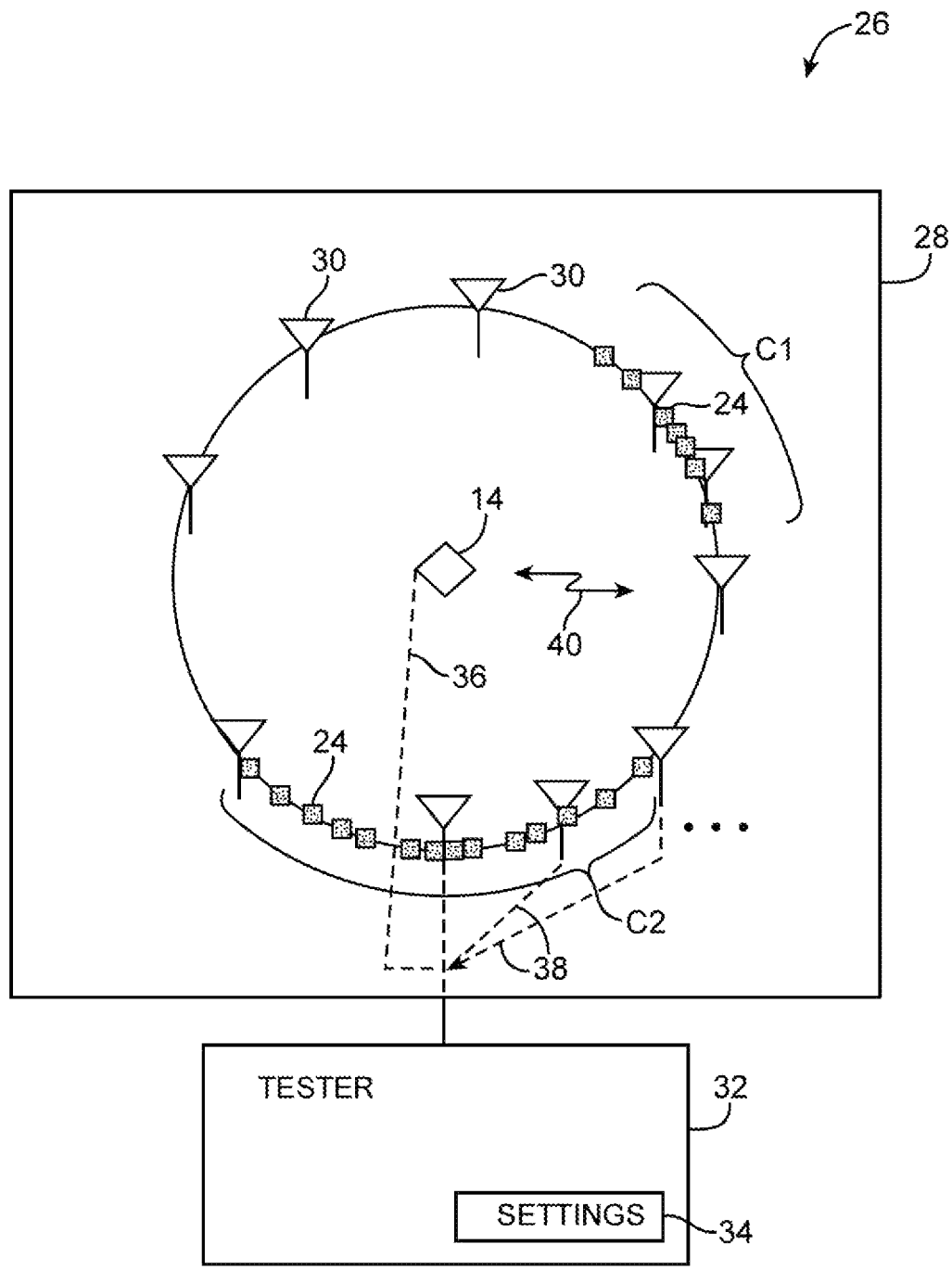
FIG. 2 is a diagram of an illustrative test system in accordance with an embodiment of the present invention.

Electronic device 14 (i.e., a device under test) may be tested in a test system such as test system 26 of FIG. 2. Test system 26 may include a tester such as tester 32. Tester 32 may include hardware (e.g., computers and specialized test boxes) that produce and gather radio-frequency test signals during communications with device under test 14. Conducted tests may be performed by attaching tester to device under test 14 using a wired path such as cable path 36. Over-the-air tests may be performed by sending and receiving wireless radio-frequency signals 40 between one or more antennas 30 and the antennas in device under test 14 (i.e., antennas 18 of FIG. 1). Antennas 30 may, if desired, be arranged in a two-dimensional pattern such as a ring-shaped array or in a three-dimensional pattern such as a sphere. Antennas 30 and device under test 14 may be housed in an anechoic chamber such as chamber 28 to reduce radio-frequency interference. Wired paths such as paths 38 may be used to connect tester 32 to over-the-air test system antennas 30.

During OTA testing, it may be desirable to accurately emulate a channel model. Test system parameters may be adjusted to optimize the accuracy of the OTA test system in emulating a given channel model. Examples of test system parameters that may be adjusted include the average power transmitted by each OTA antenna 30 and the relative positions of OTA antennas 30 within the ring or other array pattern used in system 26. Tester 32 may be loaded with data (test system settings 34) that direct tester 32 to produce appropriate average powers for each antenna 30 during testing. The positions of antennas 30, which also represent a type of test system setting, may be chosen from a set of antennas on the antenna ring, or adjusted manually, or may be adjusted by tester 32 (e.g., by using tester 32 to control antenna positioning stages and a DUT positioning stage in chamber 28). For each channel model of interest, there may be an optimum test system setup that may be used for system 26. When this setup is used, OTA antennas 30 and tester 32 will be able to accurately emulate the desired channel model.

In the example of FIG. 2, the channel model of interest has two associated clusters C1 and C2, each of which has an associated set of subpaths 24. The optimum placement of antennas 30 may require that antennas 30 be concentrated in the vicinity of clusters C1 and C2, and covers all the degree regions that all subpaths exit, as shown in FIG. 2. Other arrangements in which antennas 30 are spaced unevenly around a ring or other structure may be used if desired.

The optimum test system setup for performing over-the-air channel emulation tests with test system 26 of FIG. 2 depends on factors such as the type of device under test to be tested, the channel model of interest, and the types of resources available in test system 26.

For example, there may be different optimum placements for antennas 30 when the device under test has a MIMO array made up of three antennas 18 than when the device under test has a MIMO array made up of two antennas 18. The distance between each of antennas 18, the type of antennas used in the device under test, and the orientation of the device under test within the ring of antennas 30 also affect testing. These device under test variables are sometimes referred to herein as device under test (DUT) parameters.

Another factor that affects the operation of test system 26 is the channel model that is being used. Different channel models may, for example, contain different types and numbers of subpath clusters and these clusters may be located in different positions. As a result, the optimum configuration of powers and positions for antennas 30 will typically vary as a function of which channel model is being emulated.

The resources available in test system 26 also impose constraints. For example, the optimum setup for system 26 will depend on the number of antennas 30 that are available for use and will depend on the possible positions for these antennas within chamber 28. The count of the number of antennas 30 in system 26 and allowable antenna positions in system 26 therefore represent OTA test system constraints.

Figure 3:
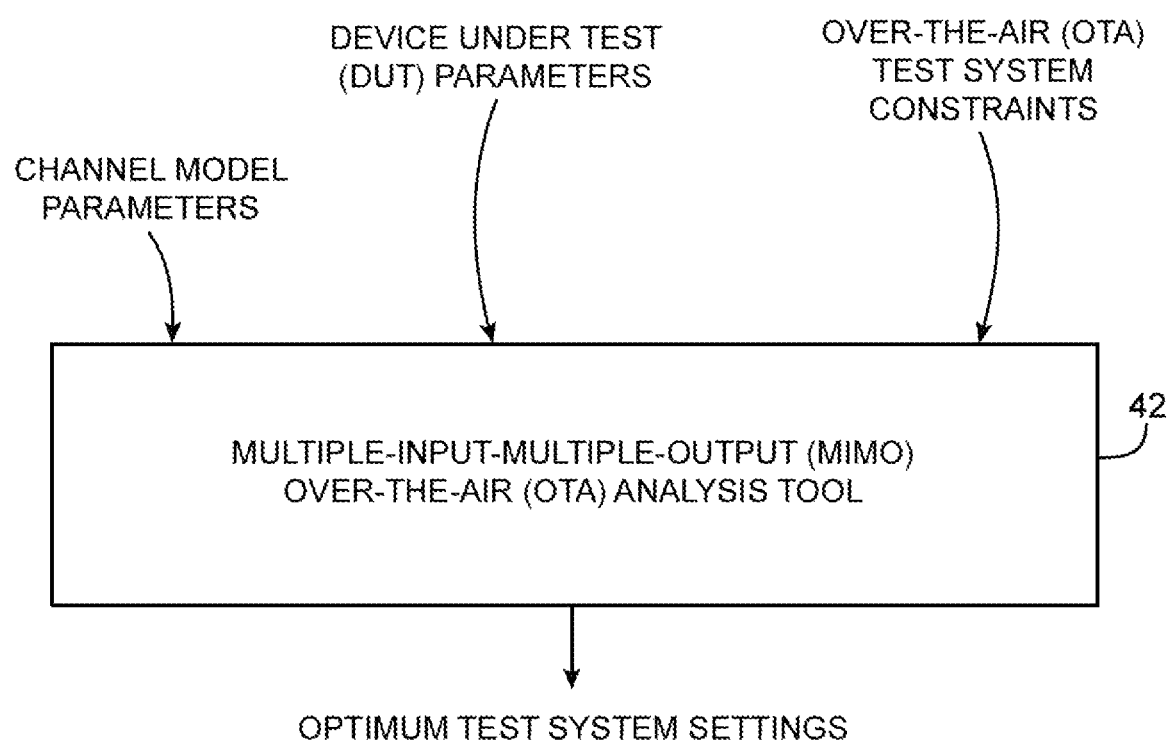
FIG. 3 is a diagram showing how a test system design and analysis tool may be used in identifying an optimum setup for a test system in accordance with an embodiment of the present invention.

To assist test personnel in identifying optimum test system settings for using test system 26 of FIG. 2 to perform over-the-air tests while emulating a given channel model, a design and analysis tool such as design and analysis tool 42 of FIG. 3 may be used to perform optimization calculations. Tool 42 may be implemented on a computer, a network of computers, or other suitable computing equipment. As shown in FIG. 3, tool 42 may use channel model parameters, device under test parameters, and test system constraints as inputs and may produce an optimum set of test system settings (e.g., optimum antenna powers and locations) as an output.

The OTA channel emulation test setup can be optimized by optimizing objective functions with different cost functions that may be set according to specific test setup and test requirements.

The objective functions may be optimized based on stochastic descriptions of an emulated channel model or based on geometric descriptions of the emulated channel model. Stochastic-based optimization may involve computing theoretical and empirical antenna performance parameters such as spatial correlation between at least two DUT antennas, whereas geometric-based optimization may involve computing theoretical and empirical antenna performance parameters such as power azimuth spectrum (i.e., the amount of power arriving at the DUT or base station as a function of the angle of arrival). Theoretical antenna performance parameters may be computed using channel model parameters, whereas empirical antenna performance parameters may be computed using over-the-air test system constraints.

Design and analysis tool 42 described in connection with FIG. 3 is merely illustrative and is not limited to determining the optimum test system settings for a fixed set of OTA test system constraints. If desired, design and analysis tool 42 may be used when designing and building different OTA MIMO test systems that emulate different channel models (e.g., tool 42 may be used to evaluate and the compare how well the channel models are being emulated by the different test systems). If desired, tool 42 may be used to determine the tradeoffs between different OTA systems having different numbers of test antennas, different locations for the test antennas, different transmit powers for the test antennas, and the accuracy of the emulation based on spatial correlation coefficients, power azimuth spectrum, and other OTA performance parameters.

Figure 4:
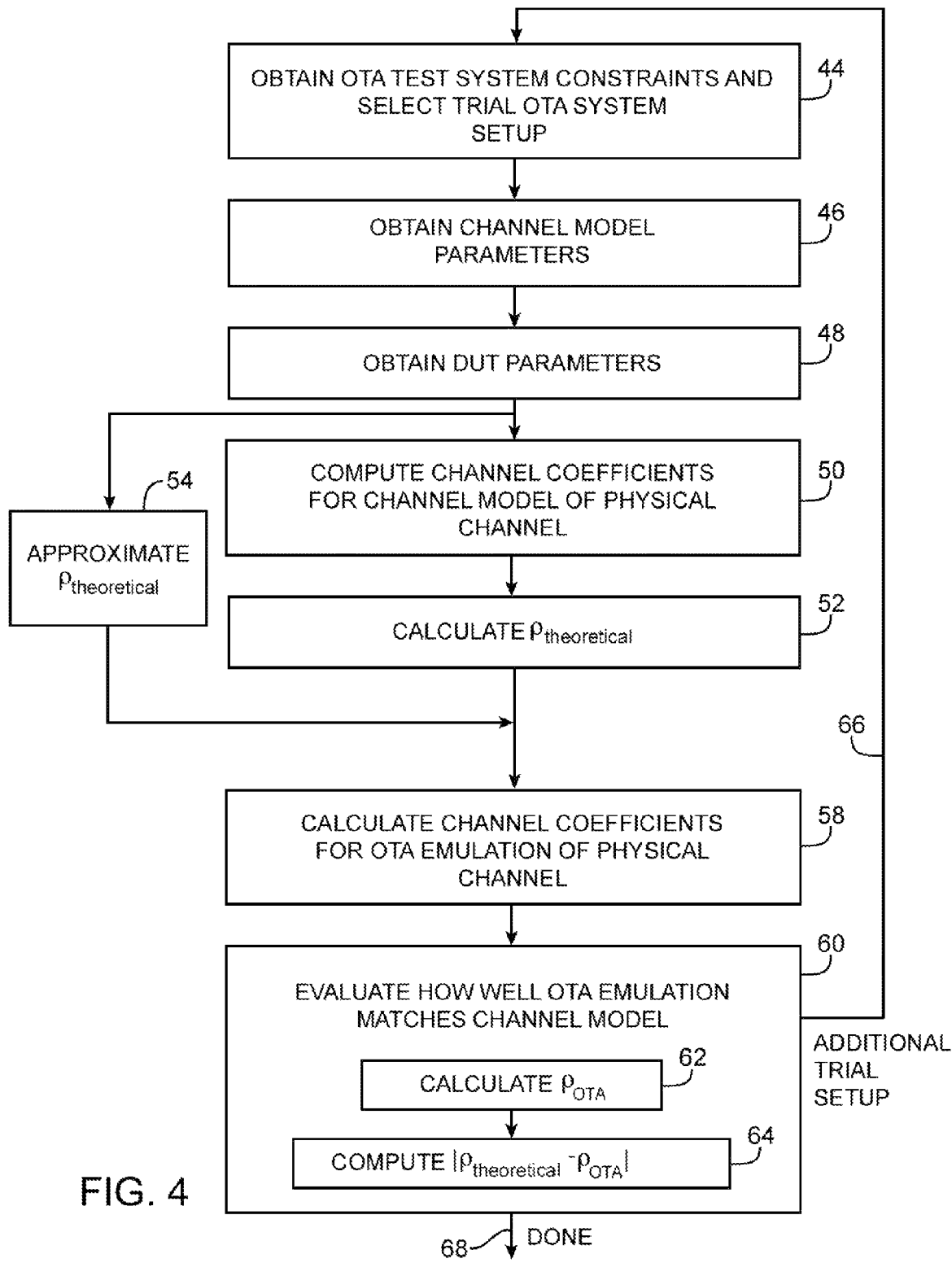
FIG. 4 is a flow chart of illustrative steps involved in using a design and analysis tool of the type shown in FIG. 3 to evaluate possible setups for a test system of the type shown in FIG. 2 by optimizing an objective function based on spatial correlation in accordance with an embodiment of the present invention.

A flow chart of illustrative optimization operations that may be performed by test design and analysis tool 42 of FIG. 3 is shown in FIG. 4.

At step 44, a trial OTA system setup that satisfies those constraints may be selected for evaluation by tool 42. For example, test system constraints such as the number of OTA antennas 30 that are available in system 26, available locations for mounting antennas 30 within chamber 28, and permissible ranges for the transmitted signal powers that are to be produced by tester 32 may be obtained. Trial test system parameters that satisfy these constraints (e.g., trial antenna locations and powers) may be generated internally by tool 42, may be retrieved from a database, or may be manually supplied by a user (as examples).

At step 46, channel model parameters may be obtained (e.g., geometric channel model parameters may be obtained from a source such as manual input or a database). The channel model parameters may define the attributes of the channel model that is to be emulated by test system 26. Examples of channel model parameters include channel power delay profile (signal amplitudes and time delays), cross-polarization ratio (i.e., the ratio XPR between horizontal and vertical polarization components), the polarizations of the base station antennas and the device under test antennas, the angle of arrival and spread for each path, angle of departure, angle of departure spread, mobile station velocity relative to the base station, the number of clusters in the channel, the number of subpaths in each cluster, the frequency (wavelength) of the radio-frequency signals being conveyed over the channel, etc.

At step 48, device-under-test parameters for DUT 14 may be obtained (e.g., from a source such as a manual input source or from a database). Examples of DUT parameters include a count of the number of antennas 18 in DUT 14, the types of antennas 18 that are in DUT 14, and the placement and orientation of each antenna 18.

At step 50 a channel coefficient equation such as the equation of FIG. 5 may be used in computing the channel coefficients h for the channel model defined by the channel parameters obtained at step 46 and the DUT parameters obtained at step 48.

In the equation of FIG. 5A, which corresponds to an illustrative spatial channel modeling (SCM) channel model, k is equal to $2\pi/\lambda$, $P_n$ is the power of the n-th path, $d_s$ is the distance from the antenna element s in base station BS to the reference (s=1) antenna, $d_u$ is the distance from the device under test (mobile station) antenna element u to the reference (u=1) antenna, $\Phi_{n,m}$ is the phase of the m-th subpath of the n-th cluster, v is a velocity vector describing the motion of the device under test, $\sigma_{sf}$ is the shadowing factor, and $\Theta_{n,m,AoD}$ and $\Theta_{n,m,AoA}$ are the angle of departure and angle of arrival for the m-th subpaths in the n-th cluster, respectively. $G_{BS}(\Theta_{n,m,AoD})$ and $G_{MS}(\Theta_{n,m,AoA})$ are the antenna gains at the base station and device under test, respectively. The channel coefficient is $h_{u,s,n}(t)$, where u is the index of the antenna number at the device under test, s is the index for the antenna at the base station, and n is the cluster number. The behavior of the channel is obtained from the summation of all of the subpaths in each cluster summed over all clusters and all antennas.

The equation of FIG. 5B is an extension to the equation of FIG. 5A. The equation of FIG. 5B takes into account cross polarization between vertically polarized and horizontally polarized signals produced from the antennas of the device under test and the antennas of the base station. In the equation of FIG. 5B, $\chi_{BS}^{(v)}(\Theta_{n,m,AoD})$ is the antenna complex response for vertically polarized signals produced by the base station, $\chi_{BS}^{(h)}(\Theta_{n,m,AoD})$ is the antenna complex response for horizontally polarized signals produced by the base station, $\chi_{MS}^{(v)}(\Theta_{n,m,AoA})$ is the antenna complex response for vertically polarized signals produced by the device under test, and $\chi_{MS}^{(h)}(\Theta_{n,m,AoA})$ is the antenna complex response for horizontally polarized signals produced by the device under test. Ratios $r_{n1}$ and $r_{n2}$ are cross polarization ratios.

At step 52, the theoretical spatial correlation for the channel model and device under test may be computed using an equation of the type shown in FIG. 6. The theoretical spatial correlation $\rho_{theoretical}$ is a measure of the theoretical amount of separation of the antennas in a MIMO array. Theoretical spatial correlation $\rho_{theoretical}$ may be a function of channel coefficients $h_{u1,s1,n}$ and $h_{u2,s2,n}$ associated with at least two antennas 18 in the device under test and the standard deviation $\sigma_h$ of each channel. Spatial correlation reduces the potential performance gains that may be obtained using a MIMO antenna array. The value of spatial correlation $\rho$ would be equal to 0 in a perfect uncorrelated antenna array and would be equal to 1 in an arrangement with a single antenna. A typical value for $\rho_{theoretical}$ might be 0.5 (as an example).

If desired, the value of $\rho_{theoretical}$ may be approximated at step 54, rather than being computed using the equation of FIG. 6. The flow chart of FIG. 7 illustrates illustrative operations that may be used in approximating the value of $\rho_{theoretical}$ at step 54. At step 67, power azimuth spectrum (PAS) may be calculated. The calculated value of PAS may then be used in calculating an approximate value for $\rho_{theoretical}$ at step 69. As shown in the expression of $\rho_{theoretical}$ in FIG. 7, spatial correlation is a function of power azimuth spectrum and vice versa. As a result, conversion between stochastic channel models and geometric channel models can be achieved using such types of equations.

At step 58, the channel coefficients corresponding to the over-the-air emulation of the physical channel that was modeled using the channel model are computed. In computing these channel coefficients, the equation of FIG. 5 may be used with appropriately substituted parameters (e.g., with angles of arrival AoA and departure AoD that are associated with the positions of antennas 30 in the OTA test system rather than the positions of the base station antennas).

At step 60, tool 42 can evaluate how well the OTA test system setup specified in step 44 is expected to perform (i.e., how closely the OTA test system emulation of the channel model will match the theoretical performance of the channel model). With one suitable arrangement, the accuracy of the OTA test system channel emulation may be evaluated by calculating the OTA wireless test system spatial correlation $\rho_{OTA}$ using the equation in FIG. 8 (step 62) and computing the difference between $\rho_{theoretical}$ and $\rho_{OTA}$ (step 64). The calculation of $\rho_{OTA}$ in FIG. 8 uses the coefficients calculated at step 58 and standard deviations associated with the OTA test system.

As indicated by line 66, the process of FIG. 4 may be repeated for numerous different trial OTA system setups, each of which will result in a corresponding value of $|\rho_{theoretical} - \rho_{OTA}|$. After a sufficient number of trial setups have been evaluated (i.e., after various OTA antenna patterns and powers have been evaluated), the pattern with the lowest value of $|\rho_{theoretical} - \rho_{OTA}|$ may be identified. If desired, computations could also continue until the value of $|\rho_{theoretical} - \rho_{OTA}|$ is less than a particular threshold value (e.g., 0.1 or 0.05). Note that various optimization methods for determining a way to achieve the best minimization outcome for some list of requirements, requested as linear or nonlinear equations, can be used to simply the computation process. When this value has been obtained (i.e., when an optimum system setup for OTA channel emulation system 26 of FIG. 2 has been identified), processing is complete (as indicated by line 68). Tool 41 may then output the optimum test system settings (e.g., by displaying these settings on a computer monitor in tool 42, by printing the optimum settings using a printer in tool 42, by storing the settings in a database or other storage in tool 42, by loading the settings directly into tester 32 as settings 34 of FIG. 2, etc.).

FIGS. 4-8 describe optimization based on spatial correlation (e.g., based on a stochastic model). In another suitable arrangement, optimization may be based on power azimuth spectrum (PAS) (e.g., based on a geometric model).

Figure 9:
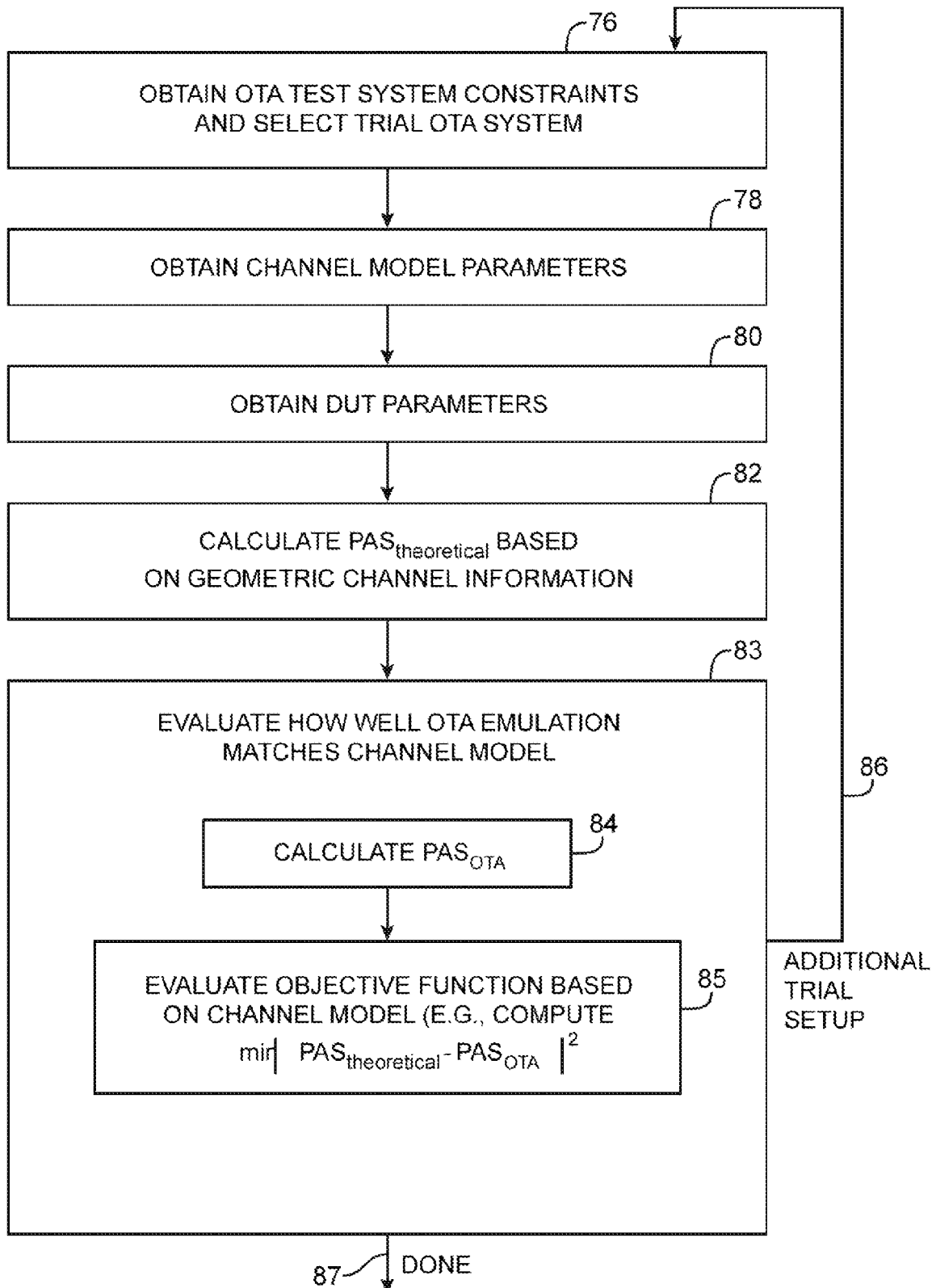
FIG. 9 is a flow chart of illustrative steps involved in using a design and analysis tool of the type shown in FIG. 3 to evaluate possible setups for a test system of the type shown in FIG. 2 by optimizing an objective function based on power azimuth spectrum in accordance with an embodiment of the present invention.

FIG. 9 shows a flow chart of illustrative steps that may be involved in optimizing a power azimuth based objective function and that may be performed by tool 42 of FIG. 3.

At step 76, a trial OTA system setup that satisfies those constraints may be selected for evaluation by tool 42. For example, test system constraints such as the number of OTA antennas 30 that are available in system 26, available locations for mounting antennas 30 within chamber 28, and permissible ranges for the transmitted signal powers that are to be produced by tester 32 may be obtained. Trial test system parameters that satisfy these constraints (e.g., trial antenna locations and powers) may be generated internally by tool 42, may be retrieved from a database, or may be manually supplied by a user (as examples).

At step 78, channel model parameters may be obtained (e.g., geometric channel model parameters obtained from a source such as manual input or a database). The channel model parameters may define the attributes of the channel model that is to be emulated by test system 26. Examples of channel model parameters include channel power delay profile (signal amplitudes and time delays), cross-polarization ratio (i.e., the ratio XPR between horizontal and vertical polarization components), the polarizations of the base station antennas and the device under test antennas, the angle of arrival and spread for each path, angle of departure, angle of departure spread, mobile station velocity relative to the base station, the number of clusters in the channel, the number of subpaths in each cluster, the frequency (wavelength) of the radio-frequency signals being conveyed over the channel, etc.

At step 80, device-under-test parameters for DUT 14 may be obtained (e.g., from a source such as a manual input source or from a database). Examples of DUT parameters include a count of the number of antennas 18 in
DUT 14, the types of antennas 18 that are in DUT 14, and the placement and orientation of each antenna 18.

At step 82, design and analysis tool 42 may evaluate an objection function based on a selected channel model. For example, the objection function may be based on a power azimuth spectrum (PAS). A theoretical PAS for the channel model and device under test may be computed using an equation of the type shown in FIG. 10. The theoretical power azimuth spectrum $PAS_{theoretical}$ is a measure of the theoretical amount of power arriving at the DUT as a function of angle of arrival. In the equation of FIG. 10, $Q_n$ is a function of the antenna gains at the base station and the device under test (i.e., $Q_n$ is a function of $G_{BS}(\Theta_{n,m,AoD})$ and $G_{MS}(\Theta_{n,m,AoA})$), and $\Theta_n$ represents the average angle of arrival based on a reference channel configuration.

At step 83, tool 42 can evaluate how well the OTA test system setup specified in step 76 is expected to perform (i.e., how closely the OTA test system emulation of the channel model will match the theoretical performance of the channel model). With one suitable arrangement, the accuracy of the OTA test system channel emulation may be evaluated by calculating the OTA wireless test system power azimuth spectrum $PAS_{OTA}$ using an equation of the type shown in FIG. 11 (step 84). In the equation of FIG. 11, $\Theta$ is a smoothing filter function for interpolation and curve fitting, $P_{n,r}$ is the transmitted power at antenna r on the ring of OTA antennas, $\Theta_n$ represents the average angle of arrival based on the over-the-air channel emulation, and $\sigma_n$ is the angular spread. At step 85, the difference between $PAS_{theoretical}$ and $PAS_{OTA}$ is computed (e.g., by computing an objective function $|PAS_{theoretical}-PAS_{OTA}|$).

The PAS objective function may be optimized over the test system parameters (e.g., power transmitted at each of the OTA antennas $P_r$ and OTA antenna position $\Psi_r$) and the DUT parameters (DUT antennas pattern and spacing D) jointly or separately.

For separate optimization, each parameter may be optimized separately by fixing the other parameters. For example, tool 42 can be configured to optimize over $P_r$ while keeping $\Psi_r$ and D fixed.

For joint optimization, multiple parameters may be optimized while the other parameters are fixed. For example, tool 42 can be configured to optimize over $P_r$ and $\Psi_r$ while keeping D fixed. If desired, design and analysis tool 42 may be configured to optimize jointly over all system and DUT parameters.

As indicated by line 86, the process of FIG. 9 may be repeated for numerous different trial OTA system setups. After a sufficient number of trial setups have been evaluated (i.e., after various OTA antenna patterns and powers have been evaluated), the pattern with the lowest objection function value of $|PAS_{theoretical}-PAS_{OTA}|$ may be identified (e.g., want to minimize $|PAS_{theoretical}-PAS_{OTA}|^2$).

If desired, computations could also continue until the value of $|PAS_{theoretical}-PAS_{OTA}|$ is less than a particular threshold value. When this value has been obtained (i.e., when an optimum system setup for OTA channel emulation system 26 of FIG. 2 has been identified), processing is complete (as indicated by line 87). Tool 42 may then output the optimum test system settings (e.g., by displaying these settings on a computer monitor in tool 42, by printing the optimum settings using a printer in tool 42, by storing the settings in a database or other storage in tool 42, by loading the settings directly into tester 32 as settings 34 of FIG. 2, etc.).

The steps shown in FIG. 9 are merely illustrative. If desired, optimization based on any suitable objective function (e.g., a spatial correlation objective function, power azimuth spectrum objection, or other cost functions) may be evaluated to determine the optimized test setup.

Figure 12:
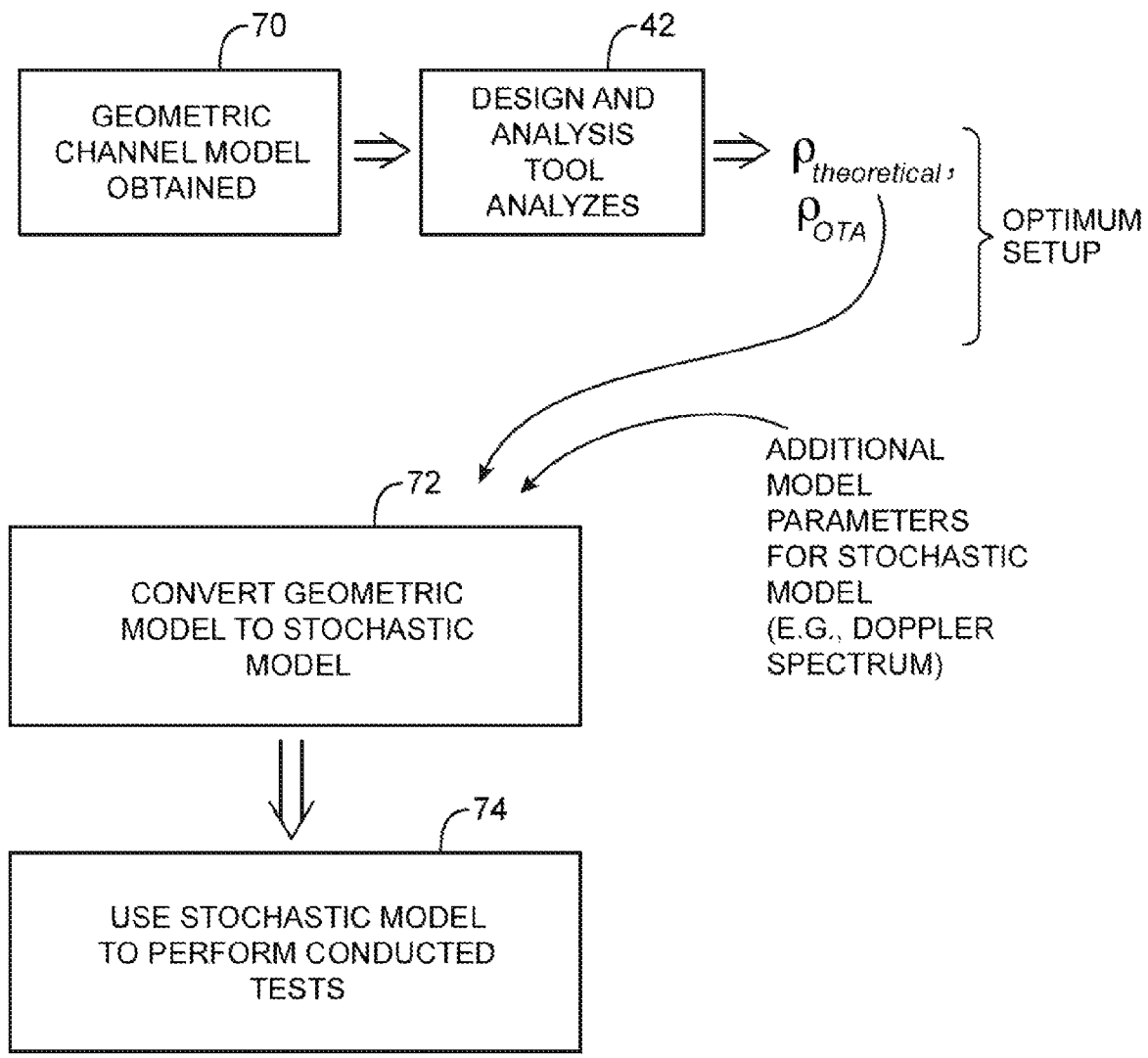
FIG. 12 is a diagram showing how a geometric channel model may be converted to a stochastic model that is used in performing conducted tests on a device under test in accordance with an embodiment of the present invention.

If desired, a geometric channel model such as a spatial channel modeling (SCM) channel model can be converted into a stochastic model for use in performing conducted tests (e.g., using tester 32 and path 36 of FIG. 2). An illustrative conversion process is illustrated in FIG. 12. As shown in FIG. 12, a theoretical geometric channel model (e.g., based on a third generation partnership program (3GPP) standard) and an OTA-simulated geometric channel model may be obtained at step 70. Design and analysis tool 42 may identify an optimum OTA test system setup for use in system 26 in emulating the geometric channel models (as described in connection with FIG. 4). In connection with these operations, tool 42 produces values for $\rho_{theoretical}$ and $\rho_{OTA}$. The value of $\rho_{theoretical}$ and additional model parameters for stochastic modeling (e.g., Doppler spectrum data) may be used by design and analysis tool 42 or other suitable computing equipment in converting the theoretical and OTA-simulated geometric models of step 70 to corresponding theoretical and OTA-simulated stochastic models (step 72). If desired, $\rho_{OTA}$ also be used in converting the geometric channel model to the stochastic model. At step 74, the OTA-simulated stochastic model may be used in performing conducted tests on device under test (i.e., tests in which tester 32 provides test signals to device under test 14 without using OTA antennas 30). This allows comparison between conducted tests and OTA tests (e.g., tests results based on OTA emulation using the OTA-simulated geometric model).

Figure 13:
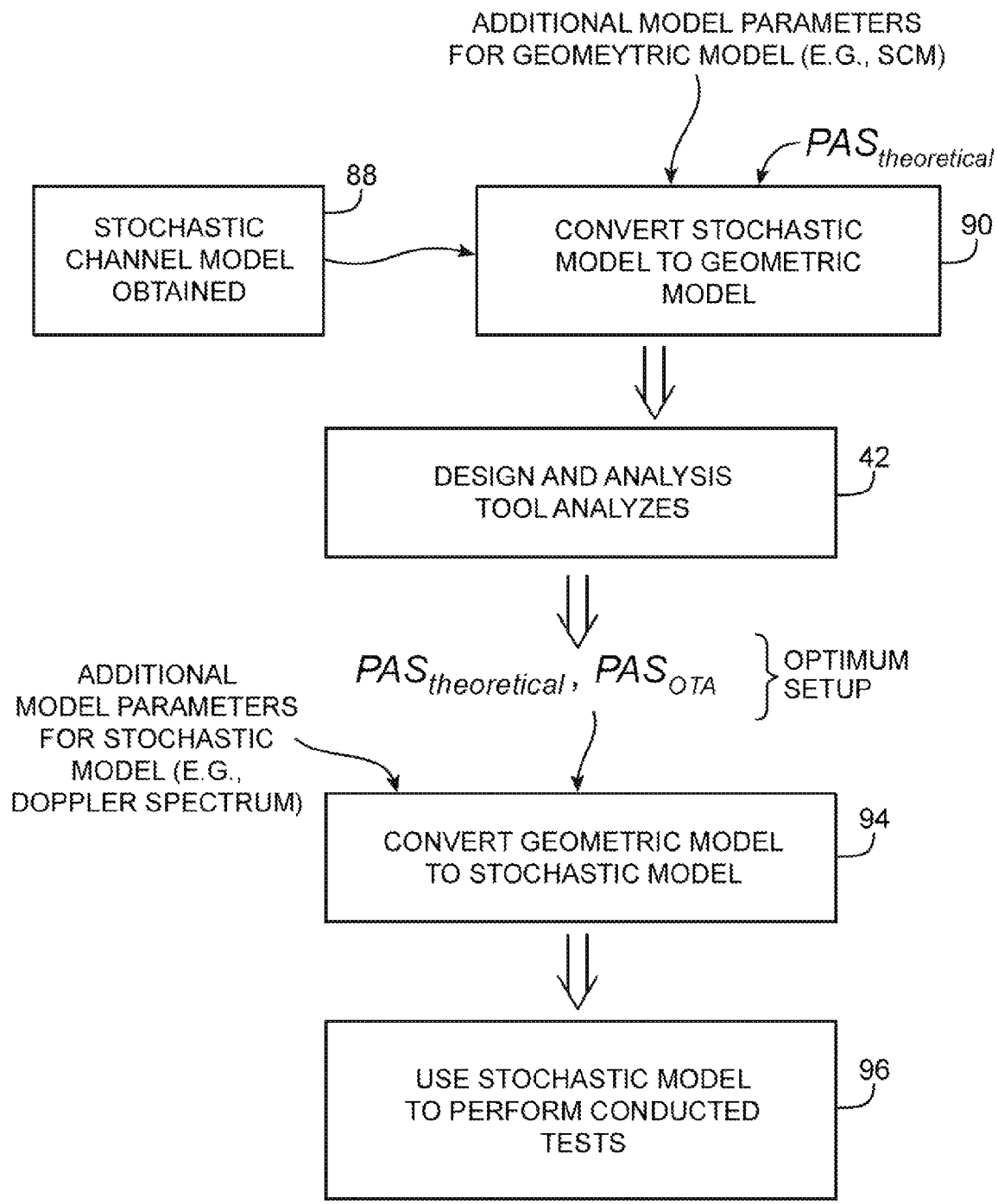
FIG. 13 is a diagram showing how a stochastic channel model may be converted to a geometric model for channel emulation optimization in accordance with an embodiment of the present invention.

If desired, a stochastic channel model such as a 3GPP channel model can be first converted into a geometric model. An illustrative conversion process is illustrated in FIG. 13. As shown in FIG. 13, a stochastic channel model may be obtained at step 88 (e.g., using a channel model definition provided from a standards organization). At step 90, the stochastic channel model is converted to a geometric model. At step 90, precomputed $PAS_{theoretical}$ and additional model parameters for geometric modeling (e.g., spatial channel modeling data) may be used in converting the stochastic model in to a corresponding geometric model. The geometric model parameters generated at step 90 may be used during the determination of optimum test settings as described in connection with step 46 in FIG. 4 and with step 78 in FIG. 9.

Design and analysis tool 42 may identify an optimum OTA test system setup for use in system 26 in emulating the geometric channel model produced by step 90 (as described in connection with FIG. 12). If desired, tool 42 may be used to generate multiple sets of optimum test settings in terms of the number of test antennas, the different possible positions of the test antennas, and the output power levels of the test antennas. A selected one of the multiple sets may then be used when converting the geometric model to a corresponding stochastic model.

In connection with these operations, tool 42 produces values for $PAS_{theoretical}$ and $PAS_{OTA}$ (as an example). If desired, other types of objection function values (e.g., $\rho_{theoretical}$ and $\rho_{OTA}$) may be used. At step 94, the value of $PAS_{theoretical}$, $PAS_{OTA}$, and additional model parameters for stochastic modeling may be used by design and analysis tool 42 or other suitable computing equipment in converting the geometric model in step 90 to a corresponding stochastic model. At step 96, the stochastic model may be used in performing conducted tests on device under test 14 (i.e., tests in which tester 32 provides test signals to device under test 14 without using OTA antennas 30). This allows comparison between OTA and conducted tests.

The foregoing is merely illustrative of the principles of this invention and various modifications can be made by those skilled in the art without departing from the scope and spirit of the invention. The foregoing embodiments may be implemented individually or in any combination.

What is claimed is:

1. A method for using a multiple-input-multiple-output over-the-air test system design and analysis tool that is implemented on computing equipment in identifying over-the-air test system settings to use when emulating a channel model with an over-the-air test system, the method comprising:

with the computing equipment, obtaining channel model parameters for the channel model, wherein the channel model parameters comprise attributes of a plurality of signal clusters;

with the computing equipment, obtaining device-under-test parameters for a device under test to be tested using the over-the-air test system; and with the computing equipment, producing the over-the-air test system settings based on the obtained channel model parameters and the obtained device under test parameters, wherein producing the over-the-air test system settings comprises computing a theoretical spatial correlation value of the channel model and computing an over-the-air spatial correlation value of emulation of the channel model with the over-the-air test system, wherein the theoretical spatial correlation value and the over-the-air spatial correlation value each account for the plurality of signal clusters.

2. The method defined in claim 1 wherein obtaining the channel model parameters comprises obtaining a device under test velocity vector.

3. The method defined in claim 1 wherein obtaining the channel model parameters comprises obtaining a distance between a base station antenna element and a reference base station antenna element.

4. The method defined in claim 1 wherein the device under test comprises a number of antennas and wherein obtaining the device-under-test parameters comprises obtaining a count of the number of antennas in the device under test.

5. The method defined in claim 1 further comprising:
with the computing equipment, obtaining over-the-air test system constraints for the over-the-air test system.

6. The method defined in claim 5 wherein obtaining the over-the-air test system constraints comprises obtaining a count of how many over-the-air antennas are to be used in the over-the-air test system.

7. The method defined in claim 6 wherein producing the over-the-air test system settings further comprises producing the over-the-air test system settings based on the over-the-air test system constraints.

8. A method for using a multiple-input-multiple-output over-the-air test system design and analysis tool that is implemented on computing equipment in identifying over-the-air test system settings to use when emulating a channel model with an over-the-air test system, the method comprising:
with the computing equipment, computing performance parameters associated with the channel model, wherein the computing the performance parameters comprises computing a theoretical spatial correlation value of the channel model and computing an over-the-air spatial correlation value of emulation of the channel model with the over-the-air test system, wherein the theoretical spatial correlation value and the over-the-air spatial correlation value each account for a plurality of signal clusters of the channel model; and with the computing equipment, computing cost-function-derived over-the-air test system settings based on the performance parameters, wherein computing the cost-function-derived over-the-air test system settings comprises minimizing a cost function that is based on a difference between the theoretical spatial correlation value and the over-the-air spatial correlation value.

9. The method defined in claim 8, wherein computing the performance parameters comprises computing at least one power azimuth spectrum value.

10. A method for using a multiple-input-multiple-output over-the-air test system design and analysis tool that is implemented on computing equipment in identifying over-the-air test system settings to use when emulating a channel model with an over-the-air test system, the method comprising:
with the computing equipment, computing performance parameters associated with the channel model, wherein the computing the performance parameters comprises computing a theoretical power azimuth spectrum value of the channel model and computing an over-the-air power azimuth spectrum value of emulation of the channel model with the over-the-air test system, wherein the theoretical power azimuth spectrum value and the over-the-air power azimuth spectrum value each account for a plurality of signal clusters of the channel model; and with the computing equipment, computing a cost-function-derived over-the-air test system settings based on the performance parameters, wherein computing the cost-function-derived over-the-air test system settings comprises minimizing a cost function that is based on a difference between the theoretical power azimuth spectrum value and the over-the-air power azimuth spectrum value.

11. The method defined in claim 8, further comprising:
with the computing equipment, obtaining over-the-air test system constraints for the over-the-air test system; and
with the computing equipment, obtaining device-under-test parameters for a device under test to be tested using the over-the-air test system.

12. The method of claim 1, further comprising determining, with the computing equipment, a difference between the theoretical spatial correlation value and the over-the-air spatial correlation value.

13. The method of claim 1, wherein the producing the over-the-air test system settings further comprises minimizing a cost function that is based on a difference between the theoretical spatial correlation value and the over-the-air spatial correlation value.

* * * * *